US006522051B1

(12) United States Patent
Nguyen et al.

(10) Patent No.: US 6,522,051 B1
(45) Date of Patent: Feb. 18, 2003

(54) MULTIELEMENT SOUND PROBE COMPRISING A COMPOSITE ELECTRICALLY CONDUCTING COATING AND METHOD FOR MAKING SAME

(75) Inventors: Ngoc-Tuan Nguyen, Mougins (FR); Nicolas Seres, Cagnes/Mer (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/701,560

(22) PCT Filed: Jun. 1, 1999

(86) PCT No.: PCT/FR99/01284

§ 371 (c)(1), (2), (4) Date: Dec. 5, 2000

(87) PCT Pub. No.: WO99/64169

PCT Pub. Date: Dec. 16, 1999

(30) Foreign Application Priority Data

Jun. 5, 1998 (FR) .......................................... 98 07094

(51) Int. Cl.[7] .............................................. H01L 41/04
(52) U.S. Cl. ...................................................... 310/336
(58) Field of Search ................................. 310/334, 336

(56) References Cited

U.S. PATENT DOCUMENTS 4,768,130 A 8/1988 Bernard et al.
4,783,888 A * 11/1988 Fujii et al. ................. 29/25.35
4,855,022 A 8/1989 Poupard et al.
5,235,463 A 8/1993 Broussoux et al.
5,262,351 A 11/1993 Bureau et al.
5,311,095 A * 5/1994 Smith et al. ................ 310/334
5,418,365 A 5/1995 Robin et al.
5,437,195 A 8/1995 Bureau et al.
5,559,388 A * 9/1996 Lorraine et al. ............ 310/327
5,618,737 A 4/1997 Robin et al.
5,732,706 A * 3/1998 White et al. ................ 600/437
5,744,898 A * 4/1998 Smith et al. ................ 310/334
5,774,960 A 7/1998 De Fraguier et al.
5,908,304 A 6/1999 Oudart et al.
6,044,533 A 4/2000 Bureau et al.
6,341,408 B2 * 1/2002 Bureau et al. ............. 29/25.35

* cited by examiner

*Primary Examiner*—Nestor Ramirez
*Assistant Examiner*—Peter Medle
(74) *Attorney, Agent, or Firm*—Oblon, Spivak, McClelland, Maier & Neustadt, P.C.

(57) ABSTRACT

The invention relates to a multielement acoustic probe comprising an acoustic support and an electrical circuit with conducting tracks connected to elementary piezoelectric transducers.

In addition, the probe comprises a film of composite conducting material placed between the piezoelectric transducers and the conducting tracks.

Conventionally, the piezoelectric transducers are subcut in order to obtain elements which are acoustically uncoupled and electrically coupled.

The presence of the film of composite conducting material favours the dimensioning of the track with respect to the subelements and constitutes an intermediate element with respect to the differences in thermal expansion between the acoustic support and the piezoelectric transducers.

Application: medical and underwater imaging.

13 Claims, 3 Drawing Sheets

MULTIELEMENT SOUND PROBE COMPRISING A COMPOSITE ELECTRICALLY CONDUCTING COATING AND METHOD FOR MAKING SAME

BACKGROUND OF THE INVENTION

The field of the invention is that of acoustic transducers which can be used especially in medical or underwater imaging, or in nondestructive testing.

DISCUSSION OF THE BACKGROUND

Generally, an acoustic probe comprises an assembly of piezoelectric transducers connected to an electrode control device via an interconnection network.

These piezoelectric transducers transmit acoustic waves which, after reflection in a given medium, provide information relating to said medium.

Typically, within the field of medical imaging, Acoustic probes consist of numerous piezoelectric elements which can be independently excited. The method for producing such probes has been described by the applicant in several documents especially for one-dimensional probes in European Patent 0 190 948 or for two-dimensional probes in French Patent 93/02586. This method consists in cutting an assembly formed from acoustic matching plates, from a piezoelectric ceramic plate, from an electrical circuit comprising metal tracks, which is generally placed on the surface of an acoustic support known by the term "backing". The cutting thus makes it possible to define elementary transducers which can be excited independently. This is because each transducer is connected to one track of the electrical circuit (polyimide film with metallized tracks or tracks cut from a metal foil) in order to allow electrical excitation.

In order to prevent undesirable vibration modes, especially the transverse mode, the elementary transducers are subcut into several piezoelectric subelements, thus they are mechanically separated but connected to the same electrical point. The subcuts are obtained by cutting beyond the metal tracks, as illustrated in FIG. 1 which shows a sectional view of an example of a unidirectional multielement probe. According to this configuration, a backing 1 supports an electrical circuit 2 with conducting tracks pi1, elementary transducers ti1 themselves comprising subelements ti1k. Typically the width of the track Pi1 is about 100 $\mu$m, which limits the number of piezoelectric subelements. Furthermore, the cut tracks are fragile and do not withstand electrical and mechanical stresses well.

The piezoelectric elements also comprise acoustic matching elements L1i1k and L2i1k with different impedances, it being possible for the element L2i1k to be metallized on the lower face in order to allow them to be earthed.

Earthing can also be carried out by inserting a thin metal film between the plate L2i1k and the ceramic or by using, in the case of the one-dimensional probes, strips L1i1k and L2i1k of smaller dimensions that those of the ceramic, thus making the earth electrode accessible on the ends of the ceramic. In the latter case, the earth is picked up by soldering or by adhesively bonding a metal film to the "free" ends of the ceramic.

SUMMARY OF THE INVENTION

In order to alleviate the aforementioned drawbacks, the present invention provides an acoustic probe comprising a film of composite conducting material.

More specifically, the subject of the invention is an acoustic probe comprising elementary piezoelectric transducers and an electrical circuit comprising metal tracks, so as to connect at least one metal track to at least one elementary transducer, each elementary transducer being formed from piezoelectric subelements which are mechanically separated and connected to the same track, characterized in that it furthermore comprises a film of composite conducting material lying between the electrical circuit and the elementary transducers, the piezoelectric subelements of the same elementary transducer being mechanically separated by gaps extending right into the said film.

Conventionally, the electrical circuit of acoustic probe according to the invention is affixed to a backing of matched impedance in order to act as an acoustic support.

Such a probe has especially the following advantages:

- since the gaps defining the piezoelectric subelements stopping in the film of conducting material the tracks of the electrical circuit are no longer "subcut" and therefore weakened;
- the film of composite conducting material allows the piezoelectric elements and the electrical circuit to be electrically connected without passing through vias as described especially in French Patent 93/02586;
- the film of composite conducting material, as it may have a thermal expansion intermediate between that of the piezoelectric material and that of the material forming the "backing", allows the deformations due to the thermal stresses from assembly, conventionally carried out at high temperature, to be absorbed;
- the tracks of the electrical circuit no longer have to be dimensioned according to the number of piezoelectric subelements that it is desired to obtain, since the gaps stop in the film of composite conducting material.

Advantageously, the film of composite conducting material may comprise an organic material of the epoxy resin type, which may especially be filled with conducting particles made of a metal such as silver, copper or nickel.

The subject of the invention is also a process for fabricating an acoustic probe according to the invention and furthermore comprising the following steps:

- the assembly of at least one layer of piezoelectric material, one film of composite conducting material and one electrical circuit comprising metal tracks;
- the cutting of the layer of piezoelectric material and of the film of composite conducting material so as to define elementary piezoelectric transducers which are electrically separate;
- the subcutting of the elementary transducers and of part of the film of composite material so as to define piezoelectric subelements which are mechanically separated and electrically connected.

According to one embodiment of the process of the invention, the cutting and subcutting steps may be carried out with a diamond saw and in one step.

BRIEF DESCRIPTION OF THE DRAWINGS

The invention will be more clearly understood and further advantages will appear upon reading the description which follows, given by way of non-limiting examples and with the help of the appended figures among which.

DESCRIPTION OF THE PREFERRED EMBODIMENTS

Generally, the acoustic probe according to the invention comprises elementary piezoelectric transducers Tij connected via a film of composite conducting material to metal tracks placed on the surface of an electrical circuit placed on a backing.

Generally, in order to produce this type of probe, one or two acoustic matching plates, of the quarter wave type for example, are fixed to the surface of the piezoelectric transducers in order to improve power transfer.

The material of these matching plates may be of the polymer type filled with mineral particles whose proportions are adjusted in order to obtain the desired acoustic properties. In general, these strips are formed by molding or machining, then assembled by adhesive bonding on one of the faces of the piezoelectric transducers.

More specifically, in the case of probes having a group of elementary transducers, attempts are made to mechanically separate the piezoelectric transducers. It is important to carry out the cutting of the acoustic matching plates so as to avoid any acoustic coupling between elementary transducers.

Moreover, in this type of multielement probe, each elementary piezoelectric transducer must be connected on one side to the earth and on the other side to a positive contact (also called live point) Generally the earth is placed toward the propagation medium, i.e. it must be on the side of the acoustic matching elements. Conventionally, the earth electrode may be a metal layer, its position may depend on the nature of the probe, i.e. whether it is a unidirectional or bidirectional probe.

Example of a Unidirectional Probe

In order to produce this type of probe, it is possible to proceed as follows:

On the surface of the electrical circuit comprising emerging tracks, for example adhesively bonded to a backing using an adhesive of the epoxy type, the layer of piezoelectric material is joined to the said backing via the conducting film 3 which, because of its character, allows the whole assembly to be adhesively bonded. The film of composite conducting material may consist of a mixture of epoxy resin and of metal particles (silver, copper, nickel etc.) with a filler content of between 50% and 80% by volume depending on the desired acoustic properties. The film has no effect on the acoustic properties of the probe since its impedance is close to that of the backing and its thickness (about 20 to 100 $\mu$m) remains small compared to the wavelength of the ultrasound wave generated by the piezoelectric material.

Subsequently, the acoustic matching plates are adhesively bonded to the surface of the layer of piezoelectric material using an adhesive of the epoxy type for example.

Figure 1:
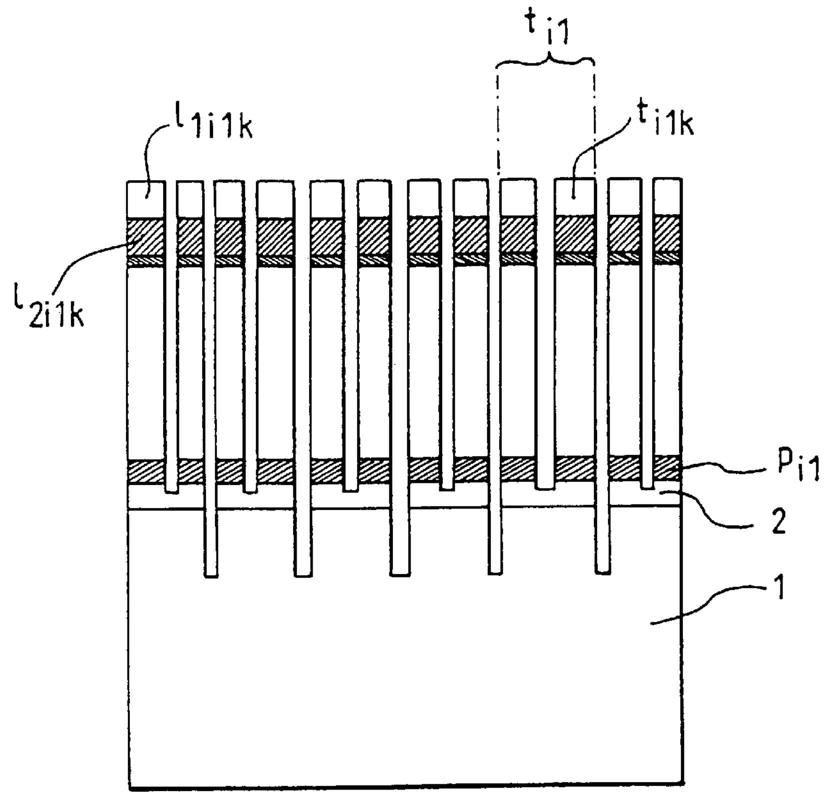
FIG.1 BACKGROUND ART
FIG. 1 illustrates a section through an example of a unidimensional acoustic probe according to the known art.
Figure 2:
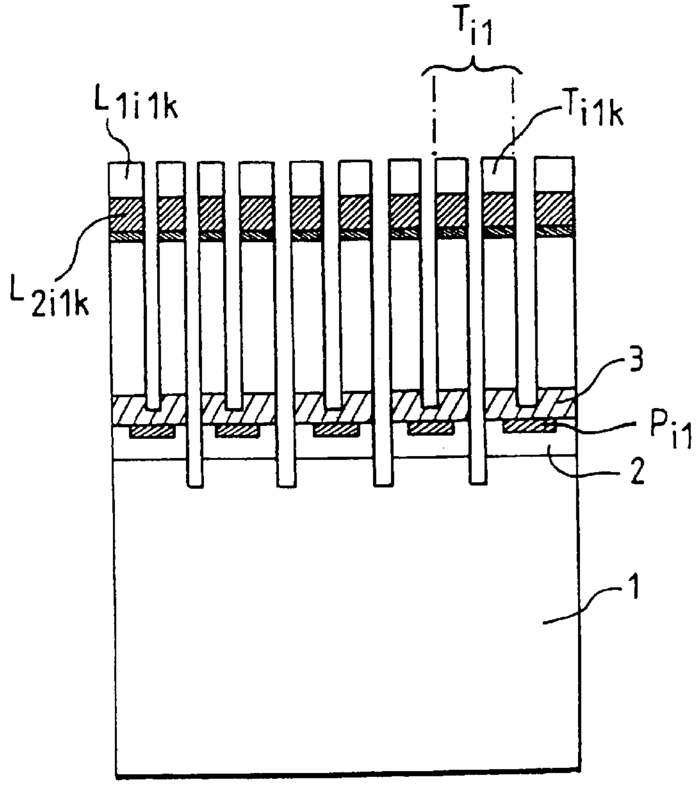
FIG. 2 illustrates a first embodiment of the invention relating to a one-dimensional probe.

Next, the assembly produced beforehand is cut by a diamond saw, in order to obtain the elementary transducers Til with a width of about 100 to 150 microns. In the same operation, the subcuts which make it possible to define the piezoelectric subelements Ti1k, whose width is about 40 to 70 microns, can be carried out. As illustrated in FIG. 2, whereas the cuts stop in the backing, the subcuts stop within the thickness of the film of composite material, thereby making it possible to preserve the electric connection between the various piezoelectric subelements Ti1k, of the same element Ti1 surmounted by these acoustic matching elements L1i1k and L2i1k.

The lower acoustic matching plate can be metallized on its lower face so as to ensure earthing on the periphery of the probe.

Example of a Bidirectional Probe

The assembly of the backing comprising the electrical circuit, of the composite conducting film and of the layer of piezoelectric material may typically be identical to that mentioned above in the case of a unidirectional probe. In order to produce an earth plane in this type of probe, it is possible to proceed as in the process described by the applicant in French Patent application published under the number 2 756 447, or by incorporating an earth plane between the transducer elements and the acoustic matching plates.

More specifically, within the scope of the invention, after having made the backing/composite conducting film/piezoelectric layer assembly, the cutting and the subcutting are carried out so as to define the elements Tij and Tijk using a diamond saw along two perpendicular axes. The assembly thus formed is covered by a conducting earth electrode M, which is affixed then adhesively bonded, and which may typically be a metal or a metallized polymer film.

The adhesive bonding of the two plates of acoustic matching material L1 and L2 may then be carried out; the first plate has a high impedance of about 5 to 12 megarayleighs, the second plate has a smaller impedance of about 2 to 4 megarayleighs. Next, the cutting of the acoustic matching plates is carried out, without cutting the earth electrode M.

Figure 3:
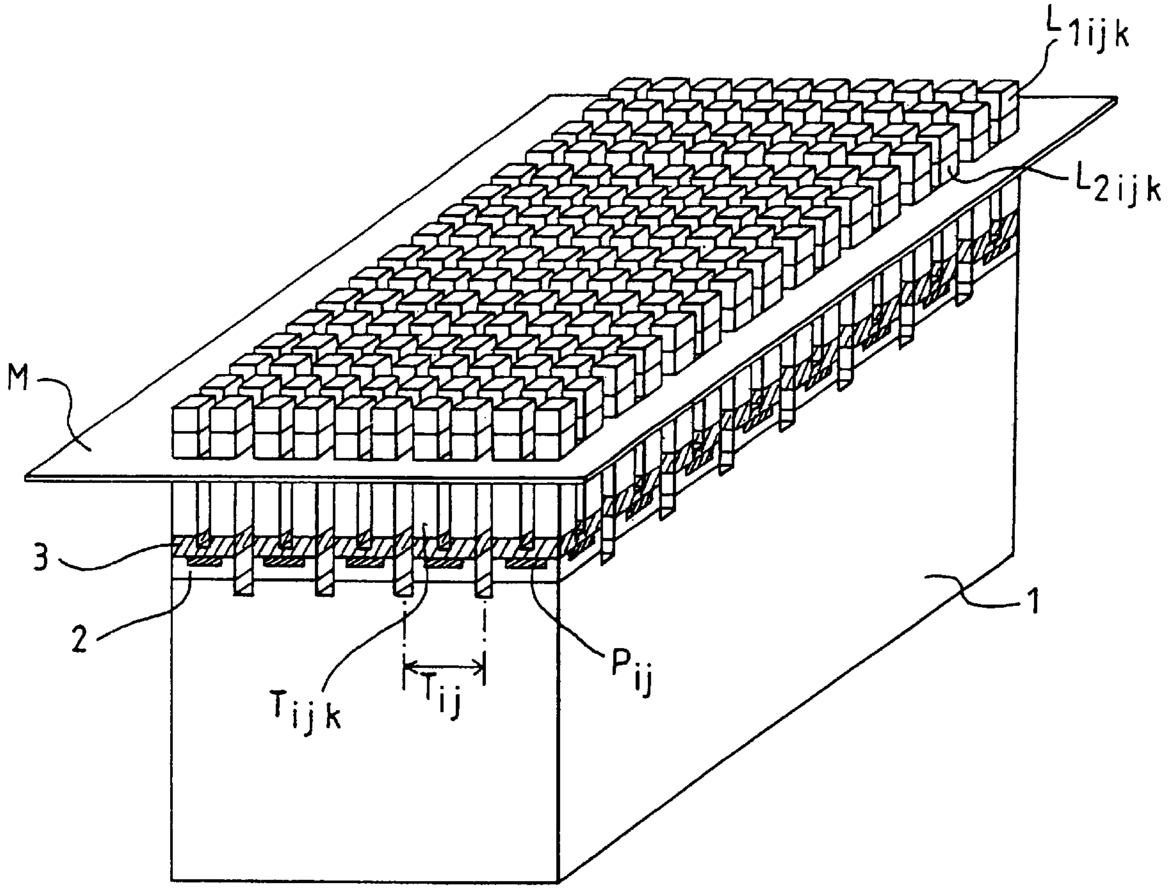
FIG. 3 illustrates a second embodiment of the invention relating to a bidimensional probe.
Figure 4:
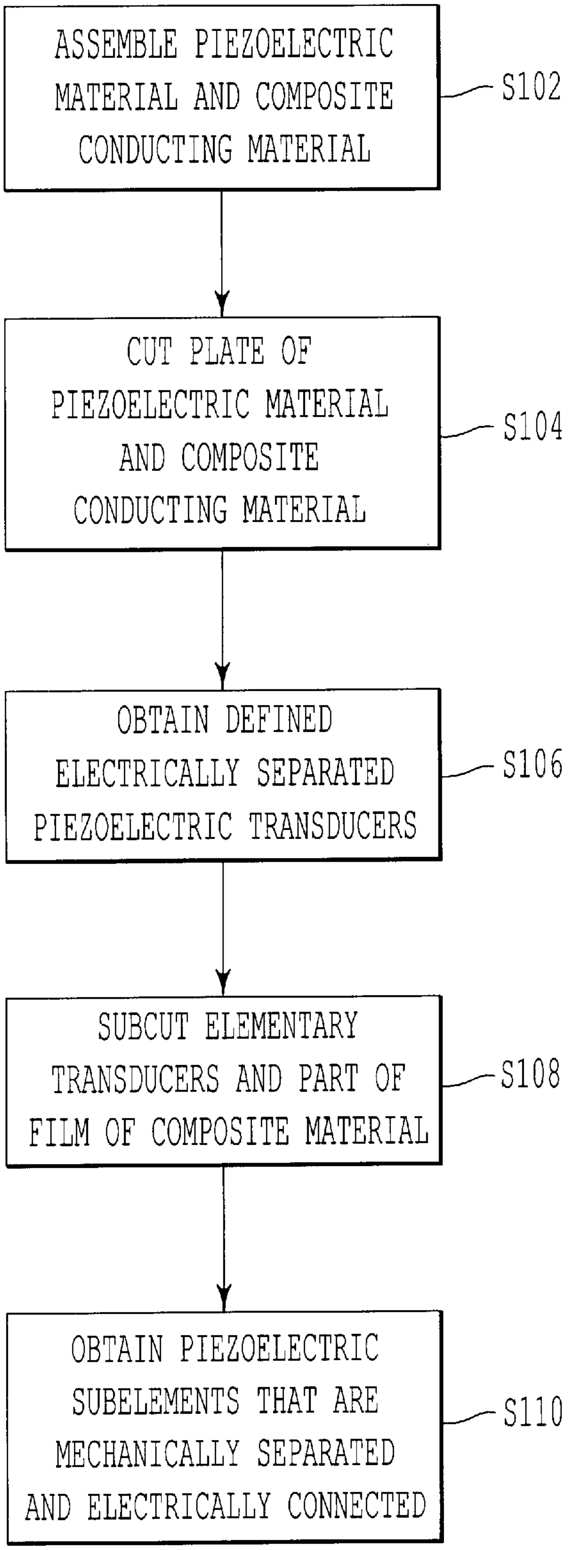
FIG. 4 illustrates a method according to one embodiment of the present invention for manufacturing the acoustic probe of the present invention.

In order to obtain this result, this cutting operation may be carried out by laser. The laser used may, for example, be an infrared laser of the $CO_2$ or a UV laser of the excimer type or of the tripled or quadrupled YAG type. A bidirectional probe as illustrated in FIG. 3 is then obtained.

What is claimed is:

1. An acoustic probe comprising:

a plurality of elementary transducers, wherein each of the elementary transducers comprises, an electrical circuit, comprising at least one metal track, piezoelectric subelements, wherein the piezoelectric subelements are mechanically separated and connected to the same track, and a film of composite conducting material between the electrical circuit and the elementary transducers, wherein the piezoelectric subelements are mechanically separated by gaps extending into the film of composite conducting material.

2. The acoustic probe according to claim 1, further comprising an acoustic support called a backing, the film of composite material having acoustic properties similar to acoustic properties of the backing.

3. The acoustic probe according to claim 1, wherein the film of composite material comprises conducting particles, the particles having a size much less than the wavelength of the ultrasound wave generated by the probe.

4. The acoustic probe according to claim 1, wherein the composite conducting film is made of an organic material of an epoxy resin or polyimide type, comprising conducting particles.

5. The acoustic probe according to claim 4, wherein the conducting particles are particles of metal such as silver, copper or nickel.

6. The acoustic probe according to claim 5, wherein the film of composite material has a conducting filler content of between 50% and 30% by volume.

7. The acoustic probe according to claim 1, wherein the thickness of the film of composite material is in the region of several tens of microns.

8. The acoustic probe according to claim 1, wherein the elementary transducers are electrically separated by gaps extending right into the electrical circuit.

9. The acoustic probe according to claim 1, wherein the electrical circuit is mechanically separated by gaps extending into an electrical circuit layer.

10. A process for fabricating an acoustic probe comprising a plurality of elementary transducers, wherein each of the elementary transducers comprises an electrical circuit, comprising at least one metal track, piezoelectric subelements, wherein the piezoelectric subelements are mechanically separated and connected to the same track, and a film of composite conducting material between the electrical circuit and the elementary transducers, wherein the piezoelectric subelements are mechanically separated by gaps extending into the film of composite conducting material, the process comprising:

assembling at least one plate of piezoelectric material, at least one film of composite conducting material, and at least one electrical circuit comprising metal tracks;

cutting the plate of piezoelectric material and the film of composite conducting material to define elementary piezoelectric transducers which are electrically separated; and subcutting the elementary transducers and part of the film of composite material, to define piezoelectric subelements which are mechanically separated and electrically connected.

11. The process for fabricating an acoustic probe according to claim 10, wherein the cutting and subcutting steps are carried out with a diamond saw.

12. The process for fabricating an acoustic probe according to claim 10, wherein the cutting and subcutting steps are carried out simultaneously.

13. Fabrication process according to claim 10 further comprising:

placing the electrical circuit on a surface of an acoustic support; and cutting into the acoustic support to define the elementary piezoelectric transducers.

* * * * *